US007274571B2

(12) United States Patent
Wei

(10) Patent No.: US 7,274,571 B2
(45) Date of Patent: Sep. 25, 2007

(54) HEATSINK

(75) Inventor: Wen Wei, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 11/074,540

(22) Filed: Mar. 8, 2005

(65) Prior Publication Data

US 2006/0203450 A1    Sep. 14, 2006

(51) Int. Cl.
  *H05K 7/20*    (2006.01)
(52) U.S. Cl. ................ 361/719; 361/700; 361/721; 174/15.2; 174/16.3; 165/80.3; 165/80.4; 165/104.26
(58) Field of Classification Search ............... None
  See application file for complete search history.

(56) References Cited

U.S. PATENT DOCUMENTS

| 6,308,771 | B1 * | 10/2001 | Tavassoli ............... 165/80.3 |
| 6,408,935 | B1 * | 6/2002 | DeHoff et al. ............ 165/80.3 |
| 6,512,673 | B1 * | 1/2003 | Wiley ..................... 361/695 |
| 6,533,028 | B2 * | 3/2003 | Sato ....................... 165/80.3 |
| 6,538,888 | B1   | 3/2003 | Wei et al. |
| 6,691,769 | B2 * | 2/2004 | Johnson et al. ........... 165/80.3 |
| 6,704,199 | B2 * | 3/2004 | Wiley ..................... 361/695 |
| 6,801,428 | B2 * | 10/2004 | Smith et al. .............. 361/687 |
| 6,883,593 | B2 * | 4/2005 | Johnson et al. ........... 165/80.3 |

OTHER PUBLICATIONS

"Short Form Specification", *PICMG 3.0*, (Jan. 2003), 34 pages.

* cited by examiner

*Primary Examiner*—Boris Chervinsky
(74) *Attorney, Agent, or Firm*—Grossman, Tucker, Perreault & Pfleger, PLLC

(57) ABSTRACT

A method according to one embodiment may include providing a heatsink having a base having a first region with a thickness greater than a second region. The heatsink may further include a plurality of fins extending from the base with at least one fin oriented at an angle to at least another fin. The method of this embodiment may also include thermally coupling the heatsink to the heat generating component. Of course, many alternatives, variations, and modifications are possible without departing from this embodiment.

15 Claims, 4 Drawing Sheets

HEATSINK

FIELD

The present disclosure relates to thermal management systems, apparatus, and methods for computer and electronics systems.

BACKGROUND

Telecommunication servers are required to provide a capacity for processing, computing, and/or transmitting data to and from millions of subscribers at a fast speed. Satisfying this capacity generally requires high density, high performance and high reliability silicon architecture platform solutions, such as advanced telecommunications computing architecture (ATCA) platforms. ATCA circuit boards, also known as blades, are designed to consume up to 200 W of power according to the ATCA form factor standards. A large amount of the power consumed by the ATCA blades may be turned into heat by various circuitry included on the blades. The heat produced by the IC's and other circuitry on the circuit boards may cause silicon junctions as well as overall printed circuit board temperature to rises. When the temperature of an integrated circuit exceeds a maximum allowance specification, the performance and reliability of the semiconductor may degrade. In order to keep the semiconductor chips operating at a high mean time between failures confidence level, dedicated air cooling of the semiconductor chips and/or printed circuit boards is required.

Among the various semiconductor chips or integrated circuits that may be included on an ATCA blade, processors are some of the most critical components that must be cooled. Controlling the temperature of processors is especially critical and challenging because of the large power density of these integrated circuits. Often heat dissipation from a processor is aided by the use of a heatsink associated with the integrated circuit chip. The dimension of the heatsink is an important factor in determining the cooling capacity of the heatsink. Due to the high density configuration provided by the ATCA specification, each blade is provided with a low-profile slot that is 1.2 inches thick for a standard telecommunication server. The 1.2 inch envelope provided for each ATCA blade must accommodate components, such as integrated circuit chips, the printed circuit board on which the components are mounted, as well as a heatsink and airflow channel sufficient to dissipate up to 200 W of heat.

By comparison to the low-profile, high-density ATCA form factor, conventional desktop PC uATX form factor generally allows a three inch height envelope for accommodating the processor, heatsink, and airflow channel for dissipating the heat generated by the processor. Enterprise server/work station form factors generally allow at least 1 U (1.75 inches) clearance to accommodate the printed circuit board, components mounted on the printed circuit board, and a heat sink for dissipating heat generated by the components mounted on the printed circuit board. For notebook computers, while the profile is slim, the power density level is much smaller than ATCA, and so less heat must be dissipated in a notebook computer. For these reasons, the thermal design for ATCA form factor is extremely problematic, as compared to other many other form factors, because the actual heatsink height available from the 1.2 inch ATCA slot is only about 0.43 inches after deducting thickness of the printed circuit board, processor, and necessary clearance. While the available height for accommodating the heatsink is small, a large amount of heat must be dissipated.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
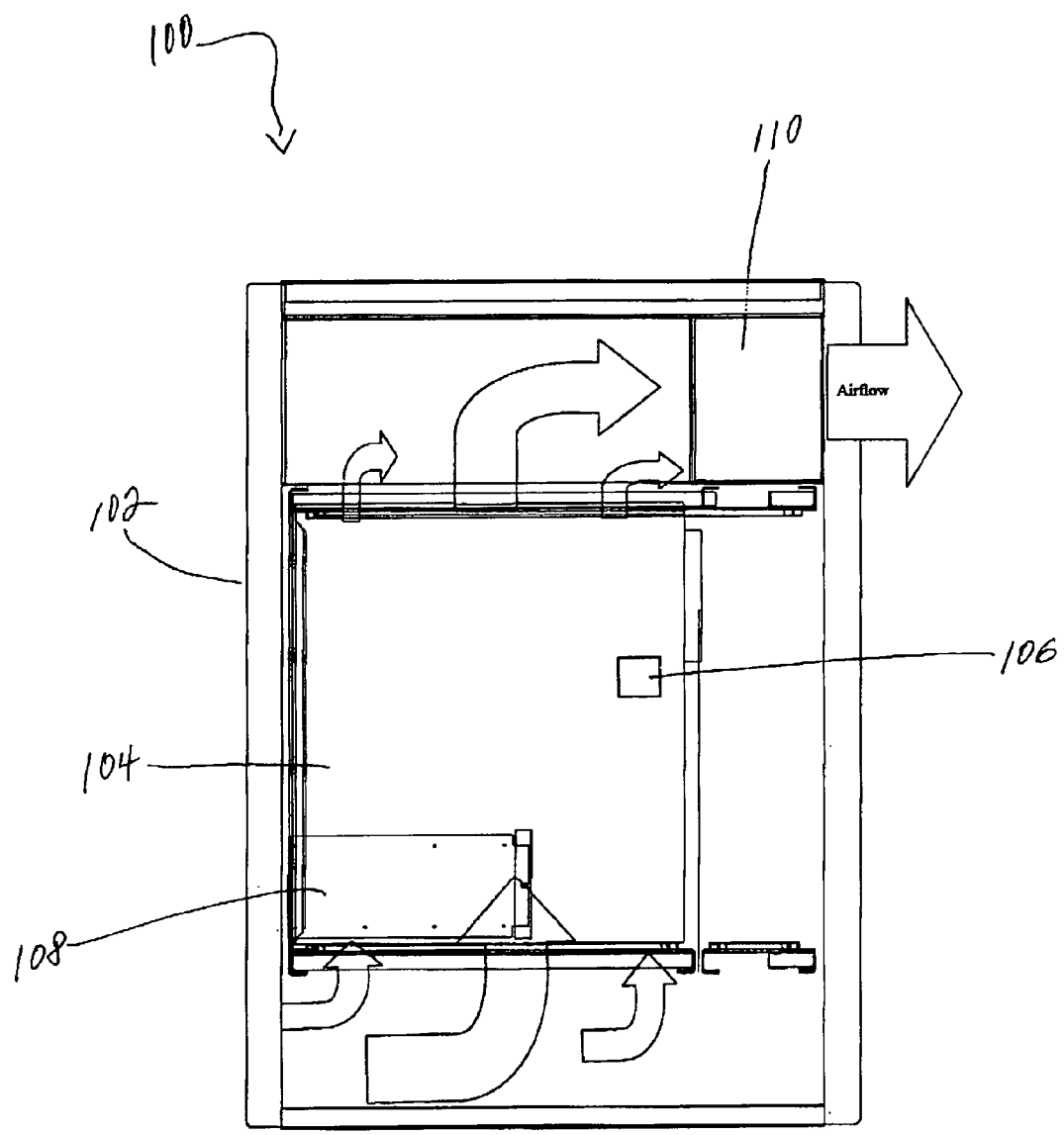
FIG. 1 illustrates an embodiment of a computer system that may utilize a heatsink consistent with the present disclosure.

With reference to FIG. 1, an embodiment of a computer system 100 is depicted. The computer system 100 may generally include a chassis 102 housing one or more printed circuit boards 104 such that the printed circuit board 104 is at least partially disposed in the chassis 102. The printed circuit board 104 may be mechanically and/or electrically coupled to the chassis 102. The printed circuit board 104 may include one or more heat generating components 106 such as an IC, e.g., chipset, processor, etc. One or more smaller circuit boards, or cards, 108 may be electrically and/or physically coupled to the printed circuit board 104. The card 108 may also include one or more heat generating components (not shown), such as a processor or other component. The system 100 may additionally include one or more fans 110 associated with a cooling system. The fans 110 may produce a flow of air through the chassis 102 to provide convective cooling of the printed circuit boards 104, cards 108, and/or other components disposed within the chassis 102.

According to one embodiment the chassis 102 may be an advanced telecommunications computing architecture (advanced TCA or ATCA) chassis, complying with, or compatible with, PICMG Advanced Telecommunications Computing Architecture (ATCA) Base Specification, PIGMG 3.0 Revision 1.0, published Dec. 30, 2002. According to such an embodiment, the circuit board 104 disposed within the chassis 102 may be an ATCA board, also referred to as an ATCA blade. Various other attributes, including the size and configuration of the chassis 102, fans 110, dimensions and clearances for printed circuit boards 104, power consumption, etc., may be dictated by the system specification. The chassis and/or any components disposed therein may alternatively be provided having a form factor and/or complying with a specification other than the advanced telecommunications computing architecture specification recited above.

Figure 2:
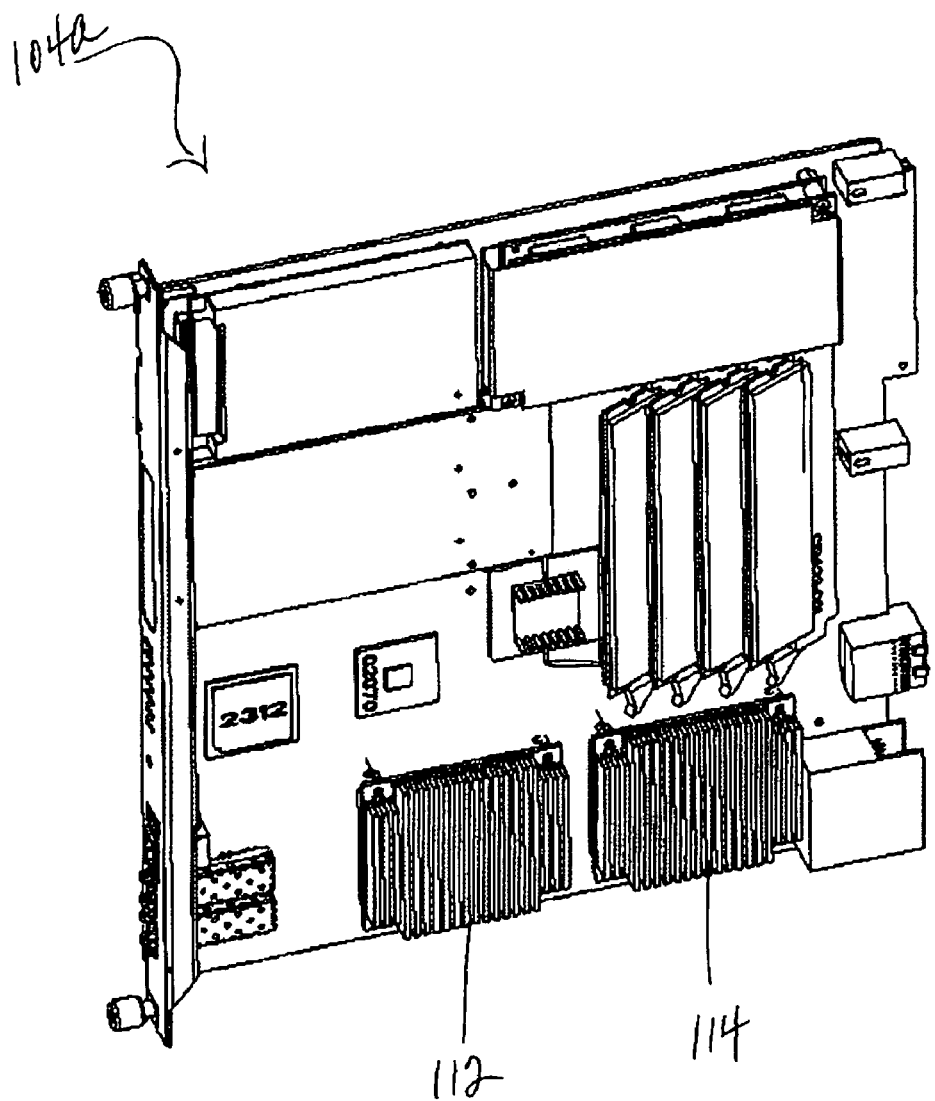
FIG. 2 depicts and embodiment of a printed circuit board including a heatsink consistent with the present disclosure.

Referring to FIG. 2, an embodiment of a printed circuit board 104a is depicted. Various components, circuits, mechanical and/or electrical connections, etc. may be disposed on and/or associated with the printed circuit board 104a without limiting the scope of the present disclosure. A printed circuit board 104a capable of being disposed within the chassis 102 may include one or more heatsinks 112, 114. Each of the heatsinks 112, 114 may be thermally coupled to one or more heat generating components (not shown), such as processors, chipsets, etc. The heatsinks 112, 114 may be thermally coupled to a respective one or more heat generating component through a variety of mechanism, without limitation. According to various embodiments, the heatsinks 112, 114 may be thermally coupled to heat generating components by being in physical contact with, or in close proximity to, the heat generating component or a housing or packaging thereof. Various thermal interface materials, including thermally conductive adhesives, may be employed to thermally couple a heatsink 112, 114 to a heat generating component. Additionally, the heatsinks 112, 114 may be mechanically coupled to the heat generating component, to the printed circuit board 104a, and/or to one or more features or components associated with the heat generating component or with the printed circuit board 104a.

Figure 3:
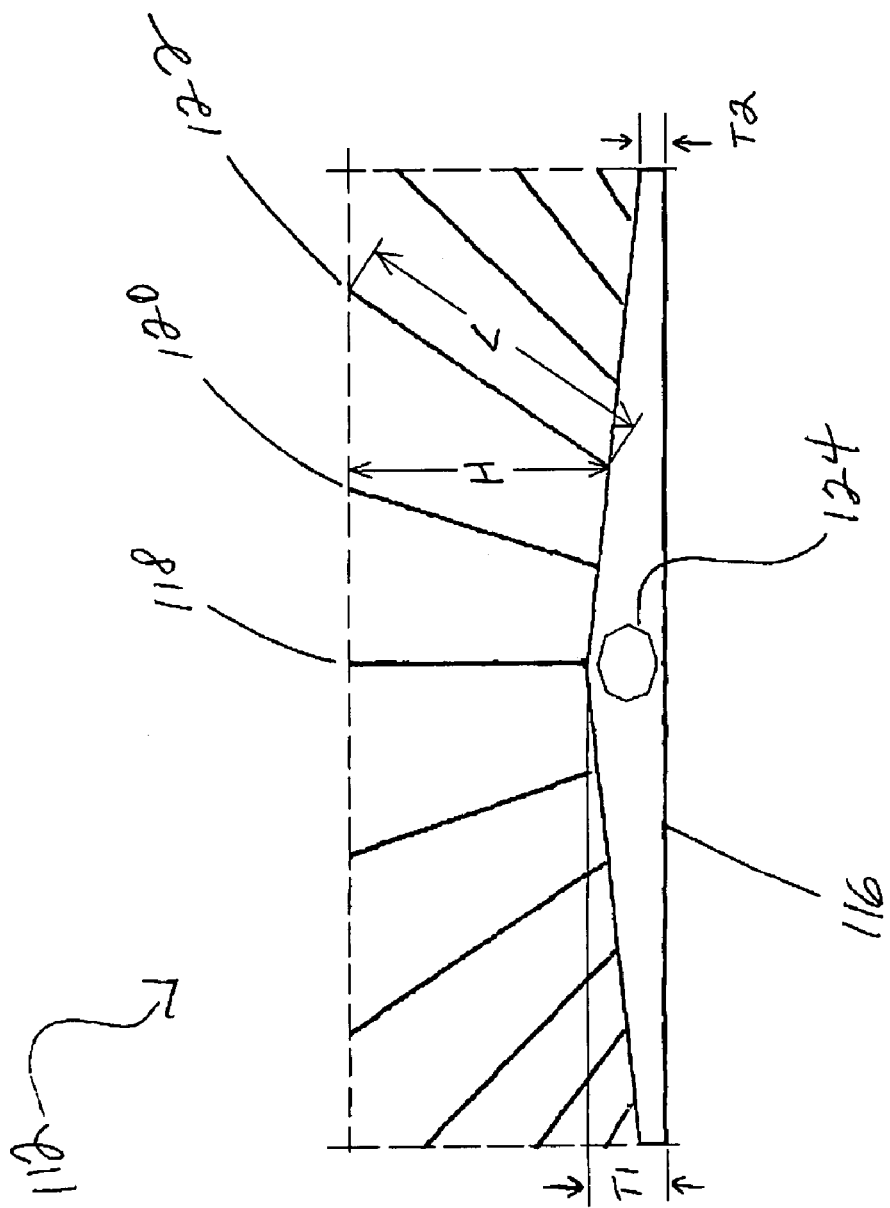
FIG. 3 is a front elevation view of an embodiment of a heatsink consistent with the present disclosure.

Turning to FIG. 3, an embodiment of a heatsink 112 is schematically illustrated in an end elevation view. As shown, a heatsink 112 consistent with the present disclosure may generally include a base 116 and a plurality of fins, e.g., 118, 120, 122, extending from the base 116. The number of fins may be varied without restriction according to specific application and/or design considerations. The heatsink 112 may be thermally coupled to a heat generating component, such as an integrated circuit or other heat generating component, and may dissipate the heat generated by the heat generating component. Dissipating heat generated by the heat generating component may allow the heatsink to reduce heat build-up in the heat generating component and/or may prevent or reduce the occurrence of overheating of the heat generating component. Generally, the base 116 of the heatsink 112 may spread heat outwardly away from a concentrated area associated with the heat generating component by conduction of heat through the base 116. Heat may be conducted through the base 116 and into the fins 118, 120, 122. Heat conducted into the base 116 and/or into the fins 118, 120, 122 may be dissipated by convection through the surfaces of the fins 118, 120, 122 and/or any exposed surfaces of the base 116 in between fins 118, 120, 122.

From a general perspective, the amount of heat dissipated by the heatsink may, at least in part, be related to two factors. First, the amount of heat dissipated by a heatsink may be influenced by the heat spreading resistance of the base outwardly from the heat source, e.g., the heat generating component, to through the base. Spreading the heat outwardly through the base from the concentrated heat source of the heat generating component may allow a greater amount of the heatsink, including the base and/or the fins, to be involved in dissipating the heat from the heat generating component. A second factor that may influence the amount of heat that may be dissipated by a heatsink is the thermal resistance of the fins. The thermal resistance of the fins is the ability to transfer heat from the fins to the air. Various factors in addition to the heat spreading resistance of the base and the thermal resistance of the fins may also influence and/or determine the amount of heat that may be dissipated by a heatsink here. Accordingly, the factors discussed above should not be construed as exclusive and/or limiting on the scope of the present disclosure.

The heat spreading resistance of the base 116, mentioned above, may be related to the thickness of the base 116. A thicker base may generally have a lower heat spreading resistance than a thin base. A high heat spreading resistance may make it difficult to "smear" heat over the bulk of the base 116, i.e. to spread the heat from the heat generating component throughout the base 116, in order to use the fins 118, 120, 122 to transfer heat via the fins 118, 120, 122 to the air. For a fixed total heatsink height, a thicker base 116 may result in shorter fins 118, 120, 122, which may reduce the surface area for transferring heat to the air. Consistent with the present disclosure, the base 116 of the heatsink 112 may be provided having a first region having a first thickness $T_1$ and a second region having a second thickness $T_2$, in which the first thickness $T_1$ of the first region is greater than the second thickness $T_2$ of the second region. In one embodiment, the first, thicker, region of the heatsink 112 may be disposed adjacent to a heat generating component and/or adjacent to the region of the heat generating component that produces the most heat. Accordingly, the thicker region of the base 116, having the lowest heat spreading resistance, may be associated with the region of highest heat flux. This arrangement may maximize heat conduction away from the heat generating component in general, and/or a hot spot of the heat generating component. In an embodiment in which the thick region of the base 116 is parallel with the fins 118, 120, 122, the thick region may enhance heat conduction along the direction of the fins 118, 120, 122. Thinner regions of the base 116 may be located away from the region of highest heat flux. Thin regions located away from the highest heat flux may be less detrimental to the performance of the heatsink 112 because the thin regions may not be required to continue conducting or spreading the heat to other portions of the heatsink 112. That is, heat may generally be conducted from a thick region outwardly to the thinner regions of the heatsink 112.

In the illustrated embodiment of heatsink 112, the base 116 has a peaked cross-sectional shape. The center region of the base 116 may be thicker than the edges of the base. The base 116 of the heatsink 112 may taper from the thicker center down toward the edges. The peak of the base 116 may be angled, as in the illustrated embodiment. Alternatively, the peak of the base 116 may be rounded, flat, etc. As used in any embodiment herein, thick region and thin region are terms indicating a dimension relative to one another. Accordingly, the term thick region should not be construed as having absolute connotations or as requiring any numerical value.

Consistent with various alternative embodiments, the base of the heatsink may be provided having various different cross-sectional shapes. For example, the thickest region of the base may be offset toward one side of the heatsink, rather than being centered. In an extreme embodiment along these lines, the thickest region of the base may be along one edge of the heatsink. The base may taper toward to opposite edge of the heatsink. In such an embodiment, the base of the heatsink may have a generally trapezoidal cross-sectional shape. The taper of the base from the thick region toward the thin region may be linear, i.e., flat, or may be arcuate. An arcuate taper between the thick region of the base and the thin region of the base may be either concave or convex. According to other embodiments, the top surface of the heatsink may have an arcuate geometry. In such an embodiment, the base of the heatsink may have a domed shape.

The base of the heatsink may have a continuous cross-sectional shape along the length of the heatsink. In such an embodiment, the thick region and thin region may each extend the entire length of the heatsink. Alternatively, the cross-sectional shape of the base may vary along the length of the heatsink. In one embodiment, the thick region may be provided as a localized region of thickness tapering to a thin region in at least three directions. In one particular embodiment along these lines, the thick region may be a localized region and the base 116 of the heatsink 112 may taper to a thin region all around the thick region. One such embodiment may include a base 116 having a domed or convex upper surface.

In still further embodiments, the base of the heatsink may have more than one thick region and/or more than one thin region. In the embodiment depicted in FIG. 3, the base 116 of the heatsink 112 has a single, generally centrally disposed, thick region having a thickness T1. The illustrated base 116 has a thin region extending along each opposed edge of the heatsink 112. Each thin region, along opposed edges of the heatsink, may have the same thickness, or may have a different thickness relative to the other thin region. In another embodiment, the base may include more than one thick region and more than one thin region. For example, the base may include two thick regions separated by a thin region. In such an embodiment, the base may taper away from each thick region to the thin region therebetween. Various alternatives may also suitable be employed. The number and arrangement of thick regions and thin regions may, at least in part, be selected based on the size, number, and location of heat generating components associated with the heatsink and the size, number, and location of any hot spots associated with such heat generating components.

According to one aspect, the thick region of the base that taper to thin regions of the base may provide efficient conduction of heat away from heat generating components that may be thermally coupled to the heatsink. The tapered heatsink base may provide unequal fin height head room, in which fins away from the thick region may have a greater head room, and may be longer than fins disposed on the thick region. Additionally, the tapered configuration may provide greater airflow passage above the heatsink for a given clearance. Accordingly, a heatsink having a tapered base configuration may provide efficient heat conduction through the base away from a concentrated heat input without sacrificing fin height and thermal performance of the fins relative to a heatsink having a uniform base thickness.

Consistent with the illustrated embodiment, and according to another aspect, the tapered base configuration may allow a heat pipe 124 to be incorporated into the heatsink 112. The localized thick region may allow the heat pipe 124 to be employed in a relatively thin heatsink base 116. As shown, while the majority of the heatsink base 116 may be too thin to support a heat pipe, in a heatsink 112 herein the heat pipe 124 may be embedded in the thick region of the base 116. The tapered base configuration may, accordingly, provide sufficient local thickness to carry and/or support a heat pipe. As is generally known, a heat pipe may provide enhanced conduction along the length of the heat pipe. The heat pipe 124 may, therefore, provide improved heat spreading away from a heat generating component thermally coupled to the heatsink 112. Similarly, the localized thick region of the base may allow the incorporation of a vapor chamber. As is generally known, a vapor chamber may generally be configured as a built in heat pipe. For example, rather than embedding a separate heat pipe, a chamber including a vaporizable medium, etc., may be formed in at least a portion of the base of the heat sink. Accordingly, as with the heat pipe, a vapor chamber may provide enhanced heat conduction along the length of the vapor chamber.

As discussed above, the thermal resistance of heatsink fins relates to the ability of the fins to transfer heat from the heatsink to the air, e.g. through convection. An increase in the thermal resistance of the fins may generally decrease heat transfer from the fins to the air. In part, the thermal resistance of the fins may be related to the fin height, which may be related to the overall fin surface area per unit length of the heatsink. The thermal resistance of the fins may also be related to the airflow across the fins. Increasing the number of fins may increase the overall fin surface area per unit length of the heatsink for a given fin height. The increase in fin density resulting from an increased number of fins may, however, decrease the cross-sectional area of the airflow passages between the fins. A decrease in the cross-sectional area of the airflow passage may decrease airflow across the fin surfaces, thereby reducing heat transfer from the fins to the air. Additionally, increasing the number of fins may decrease the exposure of the base, and decrease heat transfer between exposed regions of the base and the air. Due to these characteristics, form factors having limited space for accommodating a heatsink, e.g. having a low profile, high airflow impendence, and high thermal load, such as an ATCA form factor, may experience reduced heat dissipation effectiveness of the heatsink.

As shown in the end elevation view of FIG. 3, the plurality of fins 118, 120, 122 may be arranged extending in a divergent pattern from the base 116 of the heatsink 112. From a broad aspect, at least one fin 118 of the heatsink 112 may be oriented at an angle to at least one other fin 120 of the heatsink 112. According to one embodiment, each fin 118, 120, 122 of the heatsink 112 may be oriented at an angle to every other fin 118, 120, 122 of the heatsink. In such and embodiment the fins of the heatsink may non-parallel. As shown, the non-parallel fins may diverge from one another, such that the angle between one fin and a reference axis may be greater than the angle between an adjacent fin and the reference axis. In an embodiment consistent with the foregoing, the fins 118, 120, 122 may be arranged in a generally radial pattern, in which the fins 118, 120, 122 may project from a common point or axis. The common point or axis may be outside of the body of the heatsink 112, for example, located below the heatsink 112 depicted in FIG. 3. According to an embodiment including radial fins 118, 120, 122, the angle between adjacent fins 118, 120 and 120, 122 may be constant. In another embodiment, the angle between a second and third adjacent fin 120, 122 may be greater than the angle between a first and second adjacent fin 118, 120.

In addition to the radial fin arrangement described above, a heatsink consistent with the present disclosure may include divergently angled fins that are not radial. A heatsink having non-radial, divergently angled fins may include adjacent fins that are at an angle relative to one another. The non-radial fins may project to more than one point of intersection below the base of the heatsink. In addition to divergently arranged fins, as heatsink consistent with the present invention may include one or more fins that are parallel to one or more other fins. Accordingly, a heatsink herein may include a combination of fin arrangements.

The fins 118, 120 of the heatsink 112 may be arranged at a constant and/or variable pitch. A heatsink having fins 118, 120 arranged in a constant pitch may have an even spacing between each set of adjacent fins. The fin pitch, i.e. the spacing between the adjacent fins, may be measured linearly along the surface of the base of the heatsink from which the fins project, e.g., the top surface of the base. Alternatively, the fin pitch may be measured along an axis parallel to the base 116 of the heatsink 112. For example, the fin pitch may be measured along an axis parallel to the bottom of the base 116 of the heatsink embodiment illustrated in FIG. 3. According to a further embodiment, the fin pitch may vary between adjacent pairs of fins. For example, the spacing between a first pair of adjacent fins may be different than the spacing between a second pair of adjacent fins.

According to one aspect, the divergently angled arrangement of the fins 118, 120, 122 may provide one or more fins 118, 120, 122 having a larger heat exchange surface relative to a conventional vertical fin configuration. As shown, a divergently angled fin 122 may have a length L that is greater than the vertical head room H above the base 116 of the heatsink 112. The length L of the fin 122 may be related to the head room H above the base 116 at the point of attachment of the fin 122 and may be related to the angle of the fin 122. As a result, at least in part, of the varying thickness of the base 116 and the divergently angled arrangement of the fins 118, 120, 122, one or more of the fins 118, 120, 122 may have a different length than one or more of the other fins 118, 120, 122.

According to another aspect, the divergently angled arrangement of the fins may decrease the airflow impedance by providing larger airflow channels or passages between adjacent fins, as compared to a parallel fin arrangement. The decrease in airflow impedance may allow greater airflow through the channels or passages between adjacent fins, thereby increasing the convective heat transfer from the fins. The larger airflow channels or passages between adjacent fins of a given pitch, as measured at the surface of the base of the heatsink, may result, at least in part, from the greater spacing between tips of adjacent fins as compared to the fin pitch. The decrease in airflow impedance through the fin channels may allow a greater fin density, i.e., closer fin placement, while still permitting sufficient airflow between adjacent fins to achieve efficient heat transfer between the fins and the air.

In addition to increasing the convective heat transfer from the fins, the decreased airflow impedance provided by the divergently angled fin arrangement may also increase convective heat transfer from exposed portions of the base in between adjacent fins, i.e., the portion of the base forming the bottom of the airflow channel or passage in between the adjacent fins. Accordingly, the base may participate in dissipating heat out of the heatsink and to the air, as well as distributing the heat throughout the heatsink via conduction. Convective heat transfer from the exposed portions of the base may allow a greater amount of heat to be dissipated from the heatsink than may be experienced through the fins alone.

The length of the fins 118, 120 of the heatsink 112 may be provided to achieve a desired overall cross-sectional shape of the heatsink 112. As indicated using broken lines in FIG. 3, the length of the fins 118, 120 of the heatsink 112 may be provided to, for example, to produce a heatsink 112 having a rectangular cross-sectional shape. The cross-sectional shape of the heatsink 112 may allow the heatsink 112 to be utilized in applications requiring a specific cross-sectional shape. As evident in the illustrated embodiment, providing the fins having a length adapted to achieve a desired cross-sectional area of the heatsink may result in unequal length fins. That is, some fins may be longer than other fins in order to achieve the desired heatsink cross-sectional area.

A heatsink according to the present disclosure may be formed from any suitable material. According to one embodiment, the heatsink may be formed from a metallic material having a relatively high thermal conductivity. Such metallic material may include, for example, aluminum and/or copper as well as alloys of aluminum and/or copper. A heatsink consistent with the present disclosure may suitably be formed from various other materials having a relatively high thermal conductivity, including metallic materials, non-metallic, and/or composite materials. Furthermore, a heatsink herein may be formed from more than one material. For example, the heatsink base and the fins may be formed from different materials. Additionally, the heatsink base and/or fins may include regions formed from different materials.

A heatsink herein may be formed as a unitary construction. An embodiment of a heatsink having a constant cross-sectional shape along the length of the heatsink may be formed by processes such as extrusion. A heatsink having a non-uniform cross-sectional shape along the length of the heatsink, as well as a heatsink having a uniform cross-sectional shape, may be formed by processing such as die casting, extrusion, and skiving, etc. Various other processes may also be used for producing a heatsink consistent with the present disclosure.

According to an alternative embodiment the heatsink may be provided as an assembly including a base and a plurality of fins. The fins may be formed separately from the base. The plurality of fins may be coupled to the base to form the heatsink. In an embodiment including separately formed fins and base portion, the plurality of fins may be coupled to the base using a variety of techniques and/or mechanism. For example, the base may be provided having a plurality of slots or grooves. The plurality of fins may be inserted into respective slots in the base. The fins may be swaged into the base. In alternative embodiments, the separate fins may be soldered, welded, or otherwise thermally and mechanically coupled to the base.

Figure 4:
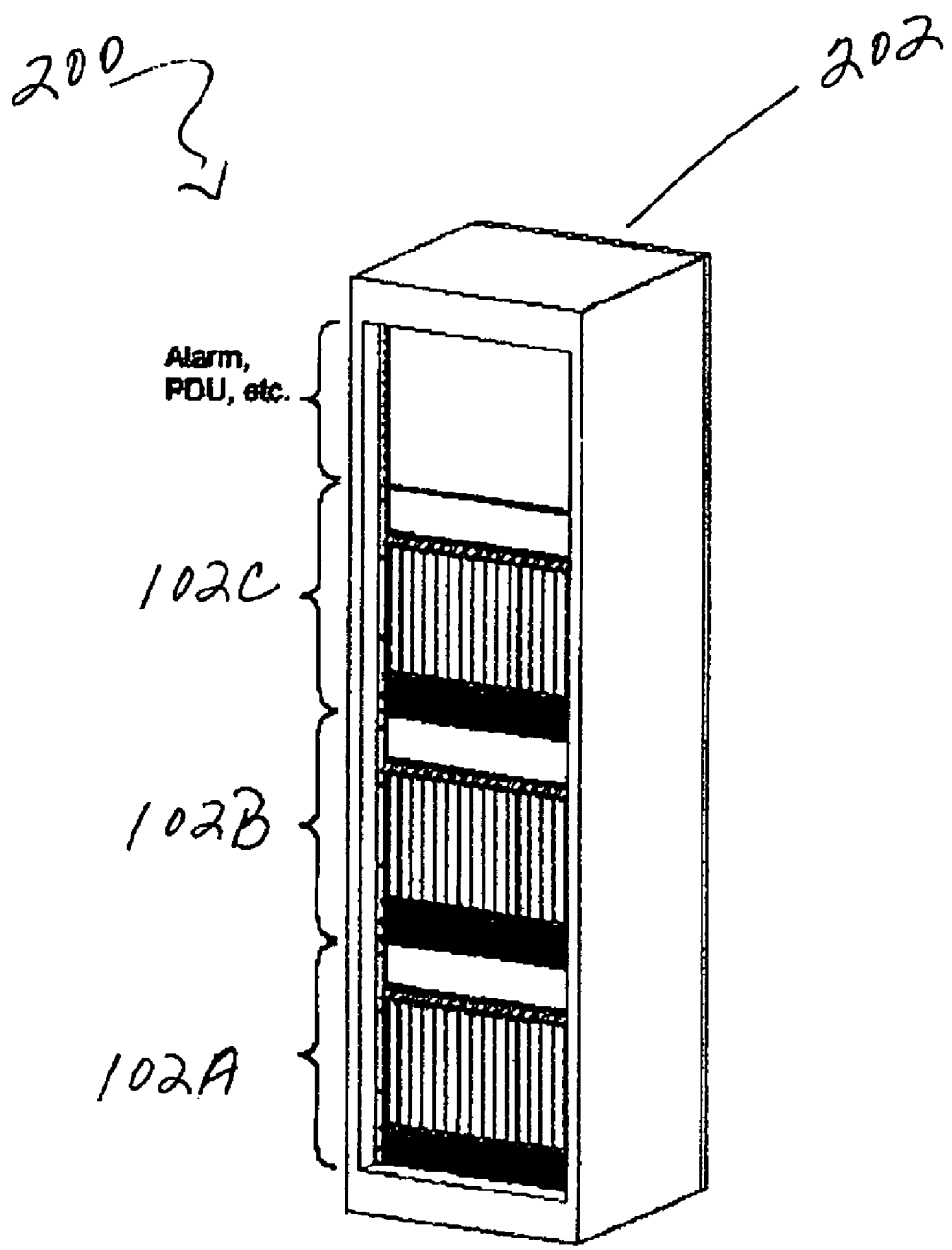
FIG. 4 is a schematic illustration of a frame that may suitably be used in connection with the present disclosure.

Referring to FIG. 4, a system 200 consistent with the present disclosure is illustrated. As depicted, the system 200 may include a frame 202. The frame 202 may accommodate and electrically couple a plurality of chassis 102A, 102B, and 102C. One or more of the chassis 102A, 102B, 102C may include at least one printed circuit board which may include a heat generating component and a heatsink consistent with any embodiment described herein. The frame 202 may include, for example, a power supply for providing power to each of the individual chassis 102A, 102B, 102C disposed in the frame 202, etc. Additionally, as mentioned above, the frame may electrically couple one or more of the chassis 102A, 102B, 102C to at least one other chassis.

According to an alternative embodiment, rather than being disposed in a common frame, a system consistent with the present disclosure may include a plurality of chassis that may be individually hardwired to one another. One or more of the plurality of chassis may include at least one printed circuit board including a heat generating component and a heatsink consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Consistent with the foregoing, there may be provided a heatsink that is capable of dissipating a high thermal load, i.e., may provide large power dissipation, associated with high speed processors or other high power electronic chips within a confined form factor, such as an ATCA form factor environment. For example, a heatsink herein may be useful for dissipating heat from an IC on a printed circuit board which may be used in form factor having small clearances for the printed circuit board. Accordingly, the heatsink may provide sufficient heat dissipation to prevent overheating of an IC in a densely populated and/or modular architecture. A heatsink herein, however, may suitably be used for any cooling or thermal energy dissipation application regardless of form factor or available clearances around the heatsink.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
   a frame comprising at least one chassis;
   a printed circuit board at least partially disposed in said chassis, said printed circuit board comprising at least one heat generating component; and
   a heatsink thermally coupled to said heat generating component, said heat sink comprising a base, said base comprising a generally peaked cross-sectional shape having a bottom surface configured to be disposed proximate said at least one heat generating component and a peaked top surface wherein said base further comprises a center region having a first thickness and a first and a second edge region having a second thickness, said first thickness being greater than said second thickness, and a plurality of fins extending from said peaked top surface of said base, wherein at least one fin is divergently angled relative to at least one other fin.

2. A system according to claim 1, wherein said first region of said heatsink base is disposed adjacent to said heat generating component.

3. A system according to claim 1, wherein said plurality of fins are oriented generally parallel to an airflow path through said chassis.

4. A system according to claim 1, wherein said at least one chassis comprises an advanced telecommunications computing architecture chassis.

5. A system according to claim 1, wherein said heatsink comprises a generally rectangular cross-sectional shape.

6. A heatsink comprising:
   a base having a generally peaked cross-sectional shape having a bottom surface configured to be disposed proximate said at least one heat generating component and a peaked top surface wherein said base further comprises a center region having a first thickness and a first and a second edge region having a second thickness, said second thickness being less than said first thickness and said first region tapering to said first and said second edge region;
   a plurality of fins extending from said peaked top surface of said base, wherein at least one fin is divergently angled relative to at least another fin.

7. A heat sink according to claim 6, wherein said first region extends longitudinally along said base.

8. A heatsink according to claim 6, wherein said base has a constant cross-sectional shape.

9. A heatsink according to claim 6, wherein said fins are radially arranged relative to an axis.

10. A heat sink according to claim 6, wherein said fins are aligned with a longitudinal axis of said base.

11. A heat sink according to claim 6, wherein at least one of said plurality of fins has a length that is different than at least another one of said plurality of fins.

12. A heatsink according to claim 6, further comprising a heat pipe disposed at least partially within said first region of said base.

13. A heat sink according to claim 12, wherein said heat pipe extends along a length of said first region of said base.

14. A heatsink according to claim 6, wherein said base and said plurality of fins comprise a unitary structure.

15. A system according to claim 6, wherein said heatsink comprises a generally rectangular cross-sectional shape.

* * * * *